United States Patent [19]
Gu

[11] Patent Number: 5,811,965
[45] Date of Patent: Sep. 22, 1998

[54] DC AND AC CURRENT SENSOR HAVING A MINOR-LOOP OPERATED CURRENT TRANSFORMER

[75] Inventor: Wen-Jian Gu, Croton, N.Y.

[73] Assignee: Philips Electronics North America Corporation, New York, N.Y.

[21] Appl. No.: 366,150

[22] Filed: Dec. 28, 1994

[51] Int. Cl.$^6$ .................................................. G01R 33/00
[52] U.S. Cl. ......................................................... 324/117 R
[58] Field of Search ............................... 324/117 R, 126, 324/127, 244, 99 R; 330/8; 363/17, 98, 99 R

[56] References Cited

U.S. PATENT DOCUMENTS

| | | | |
|---|---|---|---|
| 1,524,285 | 1/1925 | Besag .................................. | 324/117 R |
| 2,800,630 | 7/1957 | Kowalczyk ......................... | 324/117 R |
| 3,434,052 | 3/1969 | Fechant .................................... | 324/127 |
| 4,276,510 | 6/1981 | Tompkins et al. ....................... | 324/127 |
| 4,682,100 | 7/1987 | Hagelin ............................... | 324/117 R |
| 4,899,103 | 2/1990 | Katzenstein .............................. | 324/127 |
| 4,914,383 | 4/1990 | Wilkerson .......................... | 324/117 R |
| 5,053,695 | 10/1991 | Canter ................................ | 324/117 R |
| 5,196,784 | 3/1993 | Estes, Jr. .................................. | 324/127 |
| 5,223,789 | 6/1993 | Katsuyama et al. ..................... | 324/127 |
| 5,293,121 | 3/1994 | Estes, Jr. .............................. | 324/117 R |

OTHER PUBLICATIONS

Patent Abstracts of Japan, vol. 13, No. 368, p. 919, JP, A, 124772, May 17, 1980.
C. Sullender, "Magnetic Current Sensors for Space Station Freedom", IEEE, Transactions on Power Electronics, vol. 8, No. 1 Jan. 1993, pp. 69–75.
K. Harada & H. Sakamoto, "Current Sensors With A Small Saturable Core and MOSFETS", IEEE Transactions on Magnetics, vol. 24, No. 6, Nov. 1988, pp. 2910–2912.

*Primary Examiner*—Vinh P. Nguyen
*Attorney, Agent, or Firm*—David R. Treacy

[57] ABSTRACT

Current is sensed by a circuit which provides a high frequency reversing voltage to a sensing winding on a current transformer, for driving the transformer into its linear region at least once per high frequency cycle. Current through the sensing winding is sampled while the transformer is in that linear region. Preferably, the current is sampled approximately at the instants of reversal of the voltage being applied to the sensing winding, and the sample having the lower absolute value is selected as a sample proportional to the line current.

15 Claims, 4 Drawing Sheets

DC AND AC CURRENT SENSOR HAVING A MINOR-LOOP OPERATED CURRENT TRANSFORMER

CROSS REFERENCE TO RELATED APPLICATIONS

This application is related to the subject matter of patent application Ser. No. 08/159,394 filed by Wen-Jian Gu et al for an ISOLATED CURRENT SENSOR FOR DC TO HIGH FREQUENCY APPLICATIONS, (now U.S. Pat. No. 5,552,975) and concurrently filed patent application Ser. No. 08/366,149, ELECTRONIC PROCESSING UNIT, AND CIRCUIT BREAKER INCLUDING SUCH A UNIT, (now U.S. Pat. No. 5,627,717) by Howard Pein, Gregory T. Divincenzo, Paulo P. Caldeira, Wen-Jian Gu and Stephen L. Wong, assigned to the assignee of the instant application.

BACKGROUND OF THE INVENTION

1. Field of the Invention

The invention relates to devices and circuits for "non-contacting" measurement of current, whose output is an electrical signal which is isolated electrically from the conductor whose current is being sensed; and more particularly to such a sensor which does not require complex temperature compensation or expensive, critical semiconductor or magnetic components.

A very simple device of this type is the so-called current transformer, which has a transformer core with a line current winding and a secondary winding. The secondary winding is terminated with a low value resistance, so that the impedance seen from the line is very small. Usually the primary has only a few turns, or may simply consist of an insulated length of line conductor passing through a core opening and functioning as a one turn coil. Providing a sufficient insulation of the primary coil so that breakdown voltage is high, and leakage currents between primary and secondary are negligibly small, is fairly easy; and such a transformer is relatively unaffected by temperature extremes, is extremely stable, and has a very accurately known current ratio so long as the flux level in the core does not approach saturation. However, after an initial transient, DC components in the line current are not mirrored by a corresponding component in the secondary; measurement of very low frequencies requires a large core; and relatively low values of direct current components in the line current (of the order of magnitude of the peak of typical exciting current) will cause the core to saturate sufficiently for at least part of each AC cycle so that even the AC components are no longer accurately mirrored by the voltage across the secondary winding.

If a current sensor is to be used as a trip signal source in a circuit breaker, so that ratings are easily changed, it is desirable that the sensor operate down to DC even when the power source is AC. It further is desirable that an electronic trip breaker can be rated for DC operation, and accurate measurement of DC is then mandatory. For such applications, or any in which DC or very low frequencies are involved, other types of non-contacting current sensor are then required.

2. Description of the Prior Art

A known type of current sensor, which is operable down to DC, uses Hall Effect sensors. However, these are relatively temperature sensitive and position sensitive, and can require expensive calibration if high accuracy is required, such as when comparing currents in two different conductors.

A more recent development involves an active current-balancing circuit, which uses a transformer core which is driven between saturation flux values by a high frequency alternating current.

U.S. Pat. No. 4,276,510 describes a current sensor, particularly applicable to ground fault detection, in which a high frequency switching circuit alternately applies a DC voltage to the two ends of a center-tapped secondary winding on a current transformer core. The voltage value is selected to drive the core just into the knee of the B-H curve, nearly to saturation. The exciting currents through these two winding halves are equal in magnitude and in time, if there is no flux in the core due to line current (or a ground fault). If the exciting currents are unequal, this shows that the inductance is different near the two peaks of exciting current. The current difference is detected by a differential amplifier, and produces a current which is applied to a tertiary winding to buck the effect of the line current. The current through the tertiary winding becomes a measure of the line current or ground fault current.

U.S. Pat. No. 4,914,383 describes a current measuring circuit somewhat like that of the '510 patent, but provides current through second windings, alternately and in opposite directions, to move the core out of or away from saturation. In one direction the second winding is powered from the current in the conductor to be measured, while in the other direction power is obtained from a battery.

Yet another non-contacting current sensor is taught in U.S. Pat. No. 4,899,103. A high frequency alternating current is produced in alternate halves of a secondary winding, and is reversed as the core flux approaches saturation. A counter counts the times required to reach this level in the two directions; the difference in count is a measure of the current in the primary (the line current.)

Still another sensor is described by K. Harada and H. Sakamoto in "Current Sensors with a Small Saturable Core and Mosfets", IEEE Transactions on Magnetics, vol. 24, no. 6 (November 1988). This device uses the sharp increase in current, as the core saturates, to cause a self-triggered switching of the transistors. A secondary coil provides trigger voltage to the switching circuit, which is a so-called transistor core multivibrator.

The circuit described in this article uses a Permalloy 80 core, which has high permeability up to a certain flux, and then exhibits a very sharp saturation.

The Harada/Sakamoto circuit has the disadvantage that line current components at frequencies which are a significant fraction of the switching frequency cannot be accurately detected, because of the filtering which is required to reduce the effect of the current spikes. In addition, the circuit cost is undesirably high because of the need for a sharply saturating core which must be wound from metal tape.

Other current sensing circuits are described by Craig Sullender in "Magnetic Current Sensors for Space Station Freedom", IEEE Transactions on Power electronics, vol. 8, no. 1 (January, 1993). In these circuits, switching of bucking current through the core occurs at predetermined intervals, rather than in response to a sharp saturation spike. To reduce power consumption in the sensing circuit, when the voltage across a sense resistor reaches a predetermined value, a voltage pulse is applied of sufficient magnitude to bring the core to saturation in the opposite flux direction. The voltage pulse is then removed, and current through the bucking winding then falls rapidly to a value which balances the line current (except for a small magnetizing current). A sample of the voltage across a sense resistor then is proportional to the line current.

To measure bidirectional currents, two drivers, one connected to each end of the bucking coil for driving current in opposite directions, and two sense resistors are required, each connected to a corresponding comparator. Each sense resistor is connected to a corresponding sample and hold circuit.

To ensure that the current being measured is in fact balancing the line current (that is, no foldback) it is necessary to provide each voltage pulse of such magnitude and duration that saturation in alternating directions is assured, even if a massive overcurrent is flowing.

Like the Harada/Sakamoto circuit described above, the Sullenger circuits involve sharp current pulses in each direction, and have a substantial power consumption.

SUMMARY OF THE INVENTION

An object of the invention is to measure current with a non-contacting electronic/magnetic sensor accurately from DC to high frequencies, using simple circuitry.

A further object of the invention is to provide a current sensor which can use an inexpensive magnetic core.

Yet another object of the invention is to provide a current sensor which does not require continuous bucking of the effect of line current, and is free from critical timing requirements.

According to the invention, line current is sensed by a circuit which provides a high frequency reversing voltage to a sensing winding on a current transformer, sufficient to drive the transformer from saturation due to line current into its linear region at least once per high frequency cycle. By reversing the voltage applied to the sensing coil, one polarity of the voltage causes current to flow aiding the flux due to any line current then flowing. If the line current is appreciable, the transformer core is already in, or is driven into, saturation. During the following opposite polarity portion of the applied voltage, a sensing current is driven for a time sufficient to bring the transformer flux below the saturation level, thus creating a minor loop.

Current through the sensing winding is sampled while the transformer is in that linear region. Preferably, the current is sampled approximately at the instants of two successive reversals of the voltage being applied to the sensing winding, and the sample having the lower absolute value is selected as a sample proportional to the line current.

DESCRIPTION OF THE PREFERRED EMBODIMENT

Figure 1:
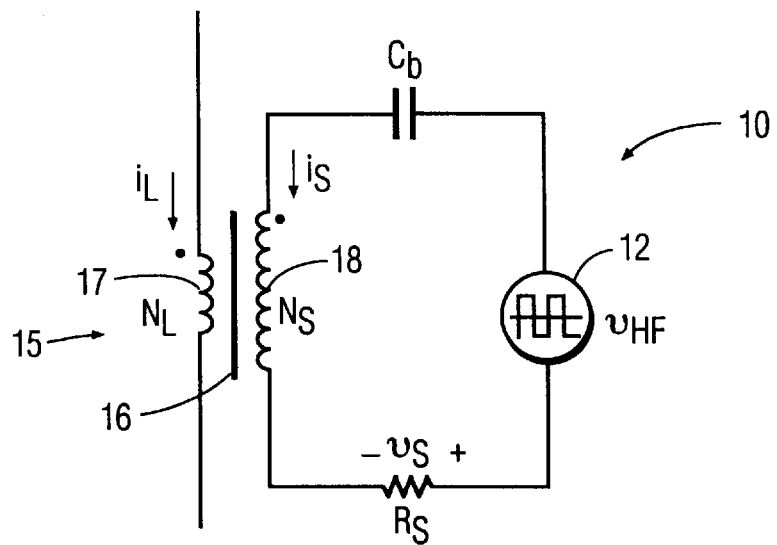
FIG. 1 is a simplified schematic diagram of a sensor according to the invention.

The current sensor 10, considered in simplified form, has only four elements: a square wave or other reversing voltage source 12, a DC blocking capacitor $C_b$, a sensing resistor $R_s$ and a current transformer 15. The current transformer 15 has a core 16 made of a material suitable for a linear current transformer, a line winding 17 through which line current $i_L$ flows, and a sensing winding 18 through which a sensing current $i_s$ flows. The voltage source 12, DC blocking capacitor $C_b$, sensing resistor $R_s$ and line winding 17 of the current transformer 15 are connected in series.

Figure 2:
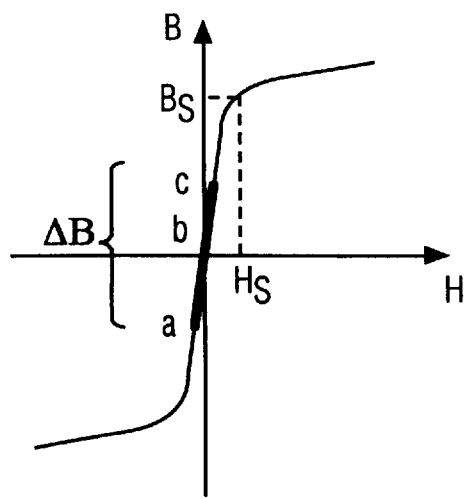
FIG. 2 shows the magnetizing path followed along the B-H curve for zero line current.

The square wave voltage source is operated at a frequency HF which is at least twice that of the highest frequency component of line current which is desired to measure, and has a peak voltage which, when the line current is zero, causes the core flux to vary over a range $\Delta B$ as shown in FIG. 2. This range is selected such that the flux values at times a and c are less than the value $B_S$ at which the core begins to saturate. To provide high accuracy of current sensing and sensitivity to small line currents, it is desirable that the required field intensity $H_S$ to produce the saturation flux $B_S$ be as small as possible. This requires the core 16 should have a high permeability. High sensitivity also requires that $\Delta B$ be small. However, if it is desired to be able to measure very large line currents, such as extreme overcurrents flowing through a circuit breaker, then $\Delta B$ should be larger, for example sufficient to cover a range of $\pm 0.8 B_S$ when line current is zero.

Figure 3:
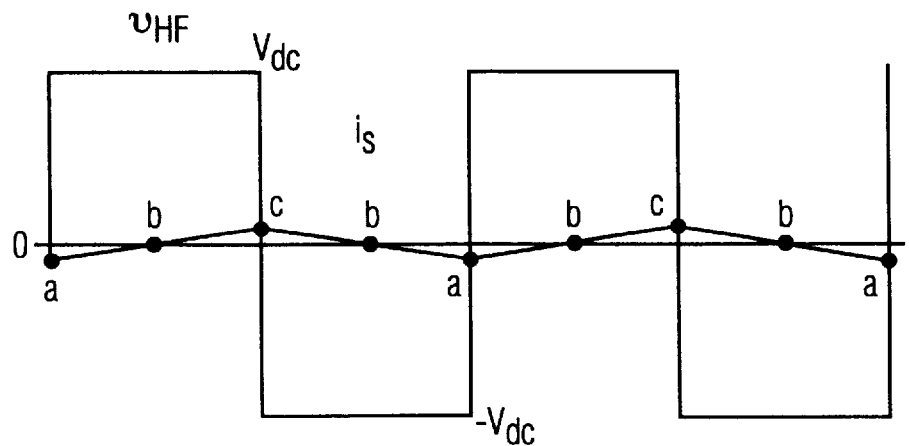
FIG. 3 is a graph of voltage and sensing current waveforms for zero line current.

FIG. 3 shows the voltage source and sensing current waveforms for zero line current. As would be expected by one of ordinary skill, the sensing current $i_s$ waveform is a triangular wave whose peaks occur at the switching instants a and c of the square wave. In the zero line current situation, the sensing current $i_s$ is symmetrical about its midpoint b.

Figure 4:
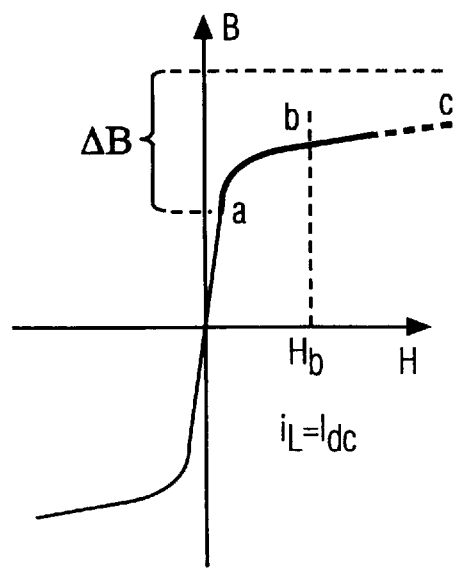
FIG. 4 shows the magnetizing path followed along the B-H curve for non-zero line current.
Figure 5:
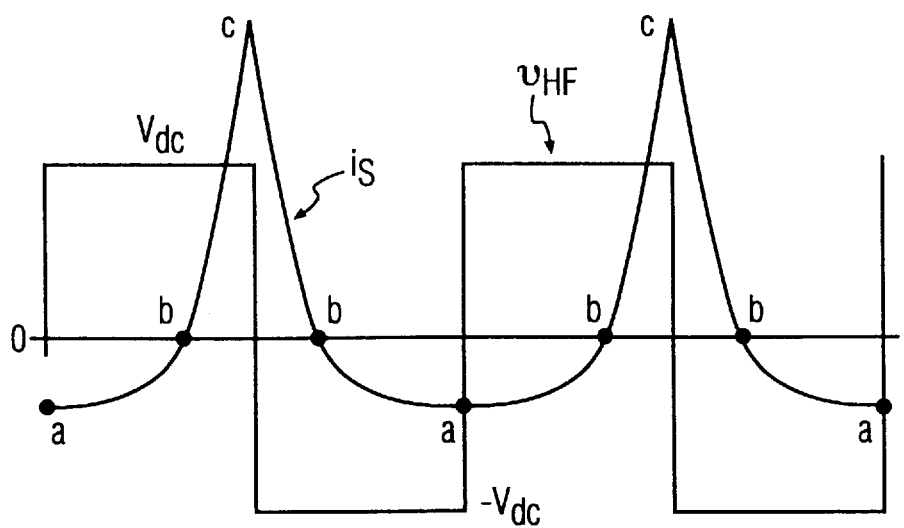
FIG. 5 is a graph of voltage and sensing current waveforms for non-zero line current.

FIGS. 4 and 5 show the core flux region traversed, and the sensing current, for a line current $i_L$ having a value $I_{DC}$ which is sufficient to saturate the core heavily. During the half cycle of the square wave which drives sensing current $i_s$ in a direction to buck the flux due to the line current $i_L$, the sensing current will have risen in the bucking direction until the magnetic intensity produced by the sensing current $i_s$ is approximately equal to that produced by the line current $i_L$, so that the core is no longer saturated (time a in FIGS. 4 and 5). Ignoring the magnetizing current, which is very small, there exists $i_s N_s = i_L N_L$ at a time a.

When the square wave voltage switches, the sensing current $i_s$ will commence rising at the same slope as in FIG. 3, and the flux B in the core will also rise toward and pass the saturation value $B_S$. As is shown clearly in FIG. 5, once the core flux becomes greater than the saturation value $B_S$ the sensing current $i_s$ rises rapidly to a peak at time c when the voltage source again switches. Because the core inductance becomes small when the core is heavily saturated, this peak value will have an absolute magnitude much greater than the value at the previous switching instant. After switching, the sensing current $i_s$ will fall rapidly, and reverse direction, until the core flux is approximately equal to $B_S$, and will then gradually increase in the bucking direction to time a. This completes one high frequency cycle.

Because the time integral of the square wave voltage is the same for the case of zero line current (FIGS. 2 and 3) and $i_L = I_{DC}$, the net flux swing $\Delta B$ is the same. So long as the line current is not too high, so that the peak flux does not exceed $B_S + \Delta B$, at the switching instant when the next high frequency half cycle aids the line current the sensing current there exists $i_s = i_L (N_L / N_s)$ at a time a. It will be clear that this also suggests selection of core materials having a sufficiently sharp knee in the saturation curve to measure a large current.

Those of ordinary skill in the art will recognize that, if the line current were $-I_{DC}$, then the curve of sensing current when plotted versus square wave voltage would have the same shape as shown in FIG. 5, but would be reversed in polarity, and displaced ½ cycle in time. Therefore, regardless of the polarity of line current, if the sensing current is sampled at the instants of voltage switching, the lower (absolute magnitude) of the two sensing current samples will be an accurate measure of the line current.

Figure 6:
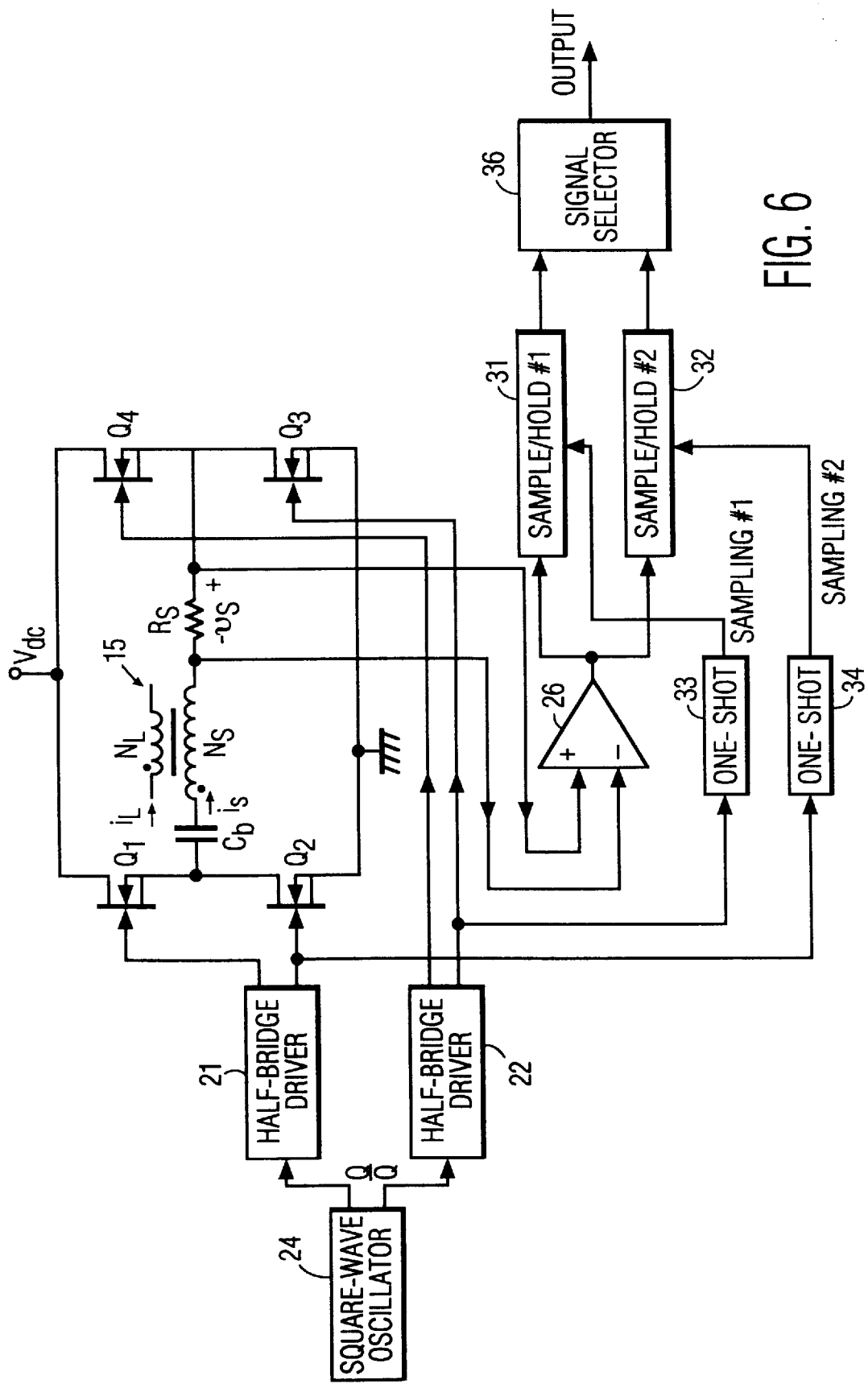
FIG. 6 is a schematic diagram of the sensor of FIG. 1 in greater detail.

A preferred practical embodiment of the circuit 10 is shown in FIG. 6. The function of the square wave voltage source is provided by switching transistors Q1, Q2, Q3 and Q4 connected in full bridge configuration to a DC voltage source $V_{DC}$. The gates of the switching transistors Q1–Q4 are connected to respective outputs of two half-bridge drivers 21 and 22, which receive the complementary outputs of a square wave oscillator 24. The operation of this DC switching circuit is conventional, and will not be further described.

The voltage across the sensing resistor $R_s$ is connected as the input to a difference amplifier 26, whose output is provided to two sample and hold circuits 28 and 29. The clock inputs to the sample and hold circuits 31 and 32 are provided respectively by one-shots 33 and 34, whose inputs are connected to the gates of transistors Q3 and Q2 respectively. The outputs of the two sample and hold circuits are connected as inputs to a signal selector circuit 36, whose output is a signal proportional to the line current $i_L$.

The operation of the circuit of FIG. 6 is identical to that described for FIG. 1. The oscillator 24, through the drivers 21 and 22, causes alternate pairs Q1, Q3 and Q2, Q4 to conduct, so that the supply voltage $V_{DC}$ is applied in reversing fashion to the series circuit of the blocking capacitor $C_b$, the sensing winding 18 of the current transformer 15, and the sensing resistor $R_S$. The one-shots 33,34 cause the sample and hold circuits 31, 32 to sample the output of the difference amplifier 26 at alternate reversals of the voltage applied to the series circuit. The signal selector selects the input sample having the smaller absolute value, and provides the value of that input sample (preserving its sign) as the output or current signal.

Figure 7:
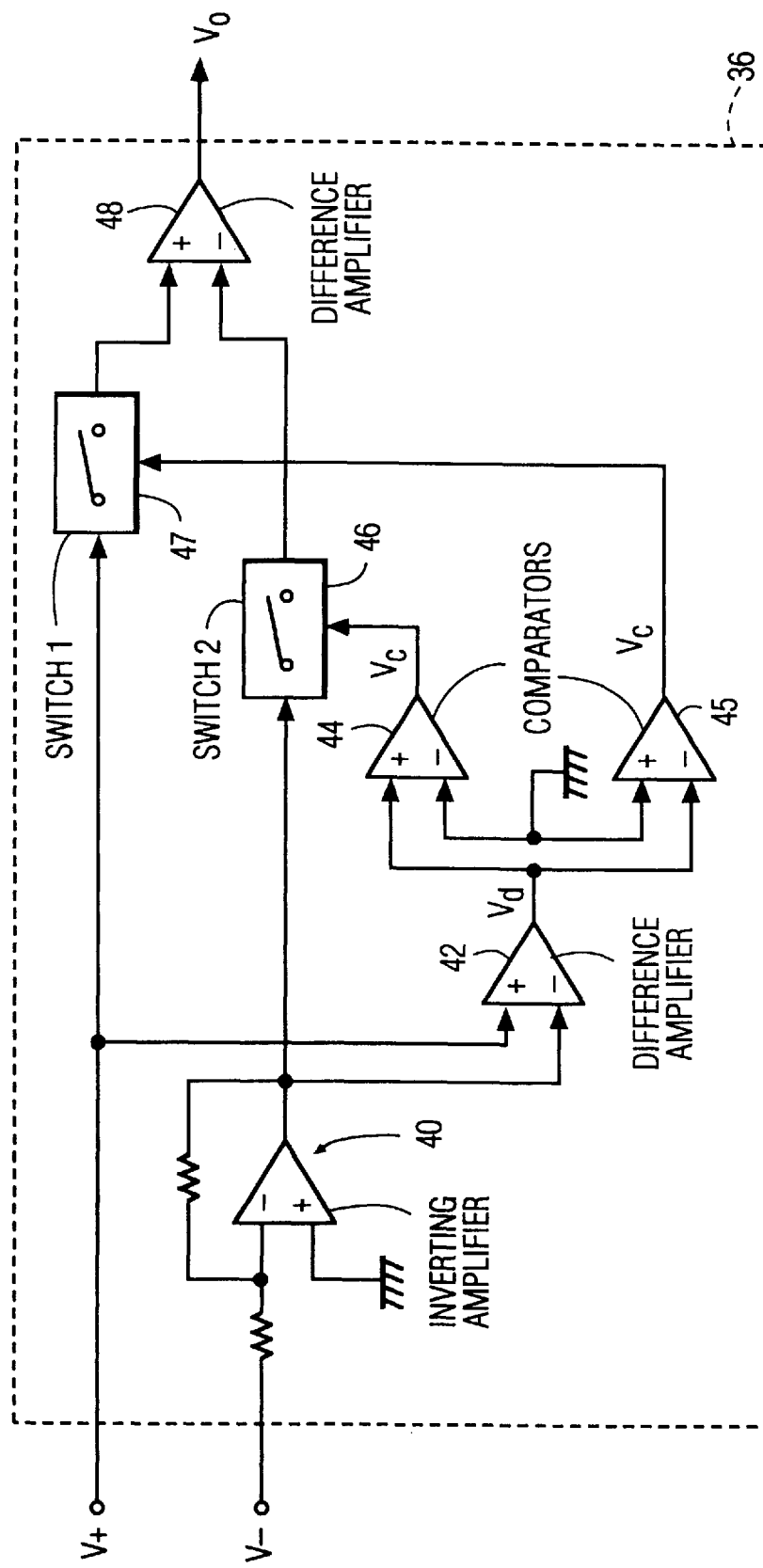
FIG. 7 is a schematic diagram of a signal selector which may be used in the circuit of FIG. 6.

One form of signal selector is shown in FIG. 7. Because sampling at one edge of the high frequency voltage $v_{HF}$ always produces a positive signal, and sampling at the other edge always produces a negative signal, there is no uncertainty regarding polarities for control purposes. Thus the sampling which is positive is denoted $V_+$ and the sampling which is negative is denoted $V_-$. The negative sampling $V_-$ is inverted in inverting amplifier 40, and is applied to the negative input of difference amplifier 42, while the positive sampling $V_+$ is applied directly to the positive input. If $|V_+|>|V_-|$ then the output $V_d$ of amplifier 42 is positive, while an opposite polarity line current will produce $|V_+|<|V_-|$ and $V_d<0$.

The output $V_d$ of amplifier 42 is fed to the positive and negative inputs, respectively, of comparators 44 and 45, whose other inputs are grounded. As a result, for each pair of samplings one comparator output will be high, and the other will be low. The outputs $V_{C2}$ and $V_{C1}$ of comparators 44 and 45 are applied as control signals to respective switch circuits 46 and 47, whose outputs in turn are connected to the positive and negative inputs of a difference amplifier 48. The output of amplifier 48 is the accurate current sample.

To implement this circuit, switch IC's such as type 4016 or 4066 may be used. If a positive output is desirable, indicative of the absolute value of the current, then a summing amplifier or analog adder can be used instead of difference amplifier 48. Alternatively, an analog data selector IC such as type 4529 can be used instead of the switches and amplifier 48, to provide a positive output. It will be clear that, alternatively, the inverting amplifier 40 can precede one of the sampling and hold circuits in FIG. 6.

Those of ordinary skill in the art will recognize that many variations on the disclosed circuits will operate according to the invention. For example, the voltage source need not be a square wave. To minimize production of electromagnetic noise or for other reasons, it may be desirable to use a waveform with rounded edges, or even a sinusoidal waveform. At some slight loss in following line current waveforms which are quite irregular, the voltage source can be asymmetric, so long as it is a repetitively reversing voltage and drives the flux once each high frequency cycle into the non-saturated region. Sampling need not occur exactly at the voltage reversal (cross-over) instant, so long as it occurs while the flux is in the non-saturated region. The current transformer core need not be linear, so long as there is a sufficient region of high permeability so that the magnetizing current, equivalent to that shown in FIG. 3, is less than the desired resolution in measuring line current after taking the transformer turns ratio into account.

While preferred because it eliminates accumulating a DC current in the sensing circuit due to nonlinearities or to inequality in the reversing voltage drive, the blocking capacitor may be omitted in many applications. Accordingly, the invention must be measured only by the appended claims.

What is claimed is:

1. A current sensor for non-contacting measurement of dc current of either polarity or alternating current in a line, comprising:

a high permeability core having a high permeability, unsaturated region on its B-H curve, a line current coil, having at least one turn on said core, for carrying the line current to be measured, said line current generating flux in said core, a sensing coil on said core, means for applying a repetitively reversing voltage to said sensing coil, said repetitively reversing voltage defining a series of transition instants when the polarity of the repetitively reversing voltage reverses, said repetitively reversing voltage causing a sensing current to flow through said sensing coil, said repetitively reversing voltage during one polarity portion thereof aiding said line current generated flux in the core and during the opposite polarity portion thereof bucking said line current generated flux in the core, the repetitively reversing voltage having a peak value and duration such that at the end of the opposite polarity portion thereof total flux in said core has been driven to an unsaturated level irrespective of the polarity and amplitude of the line current over a range of line currents to be measured, and means for obtaining a sample of said sensing current while said core is unsaturated, said sample having a value related to the line current.

2. A sensor as claimed in claim 1, wherein said means for obtaining obtains samples at instants of time determined by switching signals produced by said means for applying.

3. A sensor as claimed in claim 1, comprising a square wave voltage source having a frequency selected to be at least twice that of the highest frequency component of said line current which is to be measured, wherein said repetitively reversing voltage is a square wave alternating voltage controlled by said square wave voltage source, and has a peak voltage less than a value which will cause the core to saturate when the line current is zero, and said switching signals are derived from said square wave voltage source.

4. A sensor as claimed in claim 1, further comprising a DC blocking capacitor and a measuring resistor connected in series with said sensing coil, wherein said sample of the sensing current is proportional to the voltage across the measuring resistor.

5. A sensor as claimed in claim 1, wherein said sensor further comprises a measuring resistor connected in series with said sensing coil, and said means for applying includes:

a DC source, switching means for connecting the DC source, to the series combination of the sensing coil and measuring resistor with first one polarity and then with the opposite polarity, and at least one driver circuit for controlling the switching means.

6. A sensor as claimed in claim 5, wherein said means for obtaining a sample further includes a differential amplifier having inputs connected to respective ends of the measuring resistor, the differential amplifier having an output from which said sample is obtained.

7. A current sensor for non-contacting measurement of current in a line, comprising:

a high permeability core having a high permeability, unsaturated region on its B-H curve, a line current coil, having at least one turn on said core, for carrying the line current to be measured, a sensing coil on said core, means for applying a repetitively reversing voltage to said sensing coil, said repetitively reversing voltage defining a series of transition instants when the polarity of the repetitively reversing voltage reverses, said repetitively reversing voltage causing a sensing current to flow through said sensing coil, at least once during each cycle of said voltage said sensing current having a value such that the core is in said unsaturated region independent of the polarity of the line current, means for measuring said sensing current at two successive instants of time to provide two current levels, one of said two successive instants of time occurring when the core is in said unsaturated region, and means, responsive to said two current levels having different absolute values, for selecting the current level having the lower of the two absolute values, and providing a current signal related to the selected current level.

8. A sensor as claimed in claim 7, wherein said means for measuring obtains samples at instants of time determined by switching signals produced by said means for applying.

9. A sensor as claimed in claim 8, further comprising a square wave source, wherein said repetitively reversing voltage is a square wave alternating voltage having a frequency selected to be at least twice that of the highest frequency component of said line current which is to be measured, and a peak voltage less than a value which will cause the core to saturate when the line current is zero, and said repetitively reversing voltage and said switching signals are obtained from said square wave source.

10. A sensor as claimed in claim 8, further comprising a DC blocking capacitor and a measuring resistor connected in series with said sensing coil, wherein said samples of the sensing current are proportional to the voltage across the measuring resistor at the respective instants of time.

11. A sensor as claimed in claim 8, wherein said sensor further comprises a measuring resistor connected in series with said sensing coil, and said means for applying includes:

a DC source, switching means for connecting the DC source to the series combination of the sensing coil and measuring resistor with first one polarity and then with the opposite polarity, and at least one driver circuit for controlling the switching means, and said means for measuring includes two sample and hold circuits having respective output voltage signals, and triggering means responsive to said at least one driver circuit for controlling the instants of sampling by the sample and hold circuits, and said means for selecting includes a signal selector for selecting the lower of the outputs from the two sample and hold circuits.

12. A sensor as claimed in claim 11, wherein said means for measuring further includes a differential amplifier having inputs connected to respective ends of the measuring resistor, the differential amplifier having an output from which said samples are obtained.

13. A current sensor for non-contacting measurement of current in a line, comprising:

a high permeability core having a high permeability, unsaturated region on its B-H curve, a line current coil, having at least one turn on said core, for carrying the line current to be measured, a sensing coil on said core, a measuring resistor connected in series with said sensing coil, means for applying a square wave alternating voltage to said sensing coil, said square wave alternating voltage having a frequency selected to be at least twice that of the highest frequency component of said line current which is to be measured, and a peak voltage less than a value which will cause the core to saturate when the line current is zero, said square wave alternating voltage defining a series of transition instants when the polarity of the voltage reverses, said square wave alternating voltage causing a sensing current to flow through said sensing coil at least once during each cycle of said voltage, said sensing current having a value such that the core is in said unsaturated region independent of the polarity of the line current, and said means for applying including:

a DC source, switching means for connecting the DC source to the series combination of the sensing coil and measuring resistor with first one polarity and then with the opposite polarity, and at least one driver circuit for controlling the switching means, means for obtaining samples of said sensing current while said core is unsaturated, at instants of time determined by said square wave alternating voltage, and means, responsive to said samples, for providing a current signal having a value related to the line current.

14. A sensor as claimed in claim 13 further comprising a DC blocking capacitor and a measuring resistor connected in series with said sensing coil, wherein said sample of the sensing current is proportional to the voltage across the measuring resistor.

15. A sensor as claimed in claim 13 wherein said means for obtaining a sample further includes a differential amplifier having inputs connected to respective ends of the measuring resistor, the differential amplifier having an output from which said sample is obtained.

\* \* \* \* \*